United States Patent
Jang

(12) 
(10) Patent No.: US 6,750,692 B2
(45) Date of Patent: Jun. 15, 2004

(54) CIRCUIT AND METHOD FOR GENERATING INTERNAL CLOCK SIGNAL

(75) Inventor: Seong-Jin Jang, Sungnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/413,961

(22) Filed: Apr. 15, 2003

(65) Prior Publication Data

US 2003/0218490 A1 Nov. 27, 2003

(30) Foreign Application Priority Data

May 24, 2002 (KR) ................................ 10-2002-0028935

(51) Int. Cl.$^7$ ................................................. G06F 1/04
(52) U.S. Cl. ........................................ 327/291; 327/293
(58) Field of Search ................................ 327/291, 293, 327/294, 299, 158, 161

(56) References Cited

U.S. PATENT DOCUMENTS 6,118,319 A * 9/2000 Yamada et al. ............. 327/291
6,288,585 B1 * 9/2001 Bando et al. ............... 327/156

* cited by examiner

Primary Examiner—Linh M. Nguyen
(74) Attorney, Agent, or Firm—F. Chau & Associates, LLC

(57) ABSTRACT

The present invention discloses a circuit and a method for generating an internal clock signal, where the internal clock signal generation circuit includes a first delay portion for delaying an external clock signal by a first delay time, divides for dividing an output signal from the first delay portion, a first signal generator for generating a first signal with a pulse width equivalent to a skew monitor time by delaying an output signal from the divider by a second delay time and by combining the output signal from the divider with a signal delayed by the second delay time, a second signal generater for generating a second signal with a pulse width equivalent to a third delay time at a falling or rising edge of the output signal from the first delay portion, a time/digital signal converter for converting the skew monitor time equivalent to the pulse width of the first signal into first and second digital signals in response to the first signal, and a digital signal/time converter for reproducing the skew monitor time by inputting the first and the second digital signals in response to the second signal and generating the internal clock signal being delayed by a fourth delay time from the skew monitor time reproduced.

20 Claims, 12 Drawing Sheets

CIRCUIT AND METHOD FOR GENERATING INTERNAL CLOCK SIGNAL

BACKGROUND OF THE INVENTION

1. Field of the Invention

The present invention relates to internal clock signal generation circuits, and more particularly to a circuit and method that can produce an internal clock signal correctly in synchronization with an external clock signal.

2. Description of Related Art

When a system with a semiconductor memory device is operated at high speed, it is important to take into account a skew between a clock signal that the semiconductor memory device externally receives and data output from the semiconductor memory device, in order to correctly transfer the data output from the semiconductor memory device to an external processing device.

Typically, the semiconductor memory device includes an internal clock generation circuit to generate an internal clock signal in synchronization with an external clock signal, thereby minimizing the skew. The internal clock generation circuit typically includes a phase-locked loop circuit and a delay-locked loop circuit.

Unfortunately, the phase-locked loop circuit requires several hundred clock signals; and the delay-locked loop circuit is serially connected to a plurality of unit delay circuits comprising each of a pair of inverters, resulting in increased layout area and complexity of the circuit.

SUMMARY OF THE INVENTION

An advantage of the present invention is to provide a circuit and method that can produce an internal clock signal correctly in synchronization with an external clock signal without using a plurality of unit delay circuits, thereby simplifying the structure of the circuit.

To achieve this advantage of the present invention, an internal clock signal generation circuit comprises a first delay means for delaying an external clock signal by a first delay time; a divider for dividing an output signal from the first delay means; a first signal generation means for producing a first signal with a pulse width equivalent to a skew monitor time, by delaying an output signal from the divider by a second delay time (e.g., the first delay time+a third delay time+a fourth delay time) and by combining the output signal from the divider with a signal delayed by the second delay time; a second signal generation means for producing a second signal with a pulse width equivalent to the third delay time at a falling (or rising) edge of the output signal from the first delay means; a time/digital signal converter means for converting the skew monitor time equivalent to the pulse width of the first signal into a first and a second digital signals in response to the first signal; and a digital signal/time converter means for reproducing the skew monitor time by inputting the first and second digital signals in response to the second signal, and outputting an internal clock signal being delayed by the fourth delay time from the skew monitor time reproduced.

Furthermore, the time/digital signal converter comprises a first ring oscillator for generating in response to the first signal n number of first pulse signals, the first ring oscillator including n number of first inverting circuits serially connected; a transmitter for outputting in response to a falling (or rising) edge of the first signal the n number of the first pulse signals; a phase detector for detecting phases of the n number of the first pulse signals to produce the first digital signal; and a first counter for counting in response to a falling (or rising) edge of a $n_{th}$ pulse signal of the n number of the first pulse signals to produce the second digital signal.

The digital signal/time converter comprises a set/reset signal generation means that produces a set signal, if the first digital signal is at an even state, and produces a reset signal, if the first digital signal is at an odd state; a second ring oscillator for generating in response to the second signal and the set signal n number of second pulse signals being oscillated with a first type, and for generating in response to the second signal and the reset signal the n number of the second pulse signals being oscillated with a second type, the second ring oscillator including n number of second inverting circuits connected in series; a select control signal generation means for producing n number of control signals to output selectively a corresponding pulse signal of the second pulse signals for the case where the first digital signal is produced by detecting rising (or falling) edges of a $1_{st}$ pulse signal to the $n_{th}$ pulse signal of the first pulse signals, and output selectively a (corresponding order+1)$_{th}$ pulse signal of the second pulse signals for the case where the first digital signal is produced by detecting falling (or rising) edges of the $1_{st}$ pulse signal to the $n_{th}$ pulse signal of the first pulse signals; a selection means for selecting one pulse signal of the n number of the second pulse signals output from the second ring oscillator in response to the n number of the control signals; a second counter for counting in response to an output signal from the selection means; and a comparison means for comparing an output signal of the first counter with an output signal of the second counter, and delaying and outputting the output signal of the selection means by the fourth delay time, if the output signal of the first counter is equal to the output signal of the second counter.

To achieve a further advantage of the present invention, a method for generating an internal clock signal comprises generating a first clock signal by delaying an external clock signal by a first delay time; generating a second clock signal by dividing the first clock signal; generating a third clock signal by delaying the second clock signal by a second delay time (the first delay time+a third delay time+a fourth delay time), and generating a first signal with a pulse width equivalent to a skew monitor time in combination with the second clock signal and the third clock signal; generating a second signal with a pulse width equivalent to the third delay time at a falling (or rising) edge of the first clock signal; converting the skew monitor time equivalent to the pulse width of the first signal into a first and a second a digital signals in response to the first signal; and reproducing the skew monitor time by inputting the first and the second digital signals in response to the second signal, and generating the internal clock signal being delayed by the fourth delay time from the skew monitor time reproduced.

Preferably, the time/digital signal converting comprises generating n number of first pulse signals being oscillated in response to the first signal; outputting the n number of the first pulse signals in response to a falling (or rising) edge of the first signal; and detecting phases of the n number of the first pulse signals to produce the first digital signal, and counting in response to a falling (or rising) edge of a $n_{th}$ pulse signal of the n number of the first pulse signals to produce the second digital signal.

Preferably, the digital signal/time converting comprises producing a set signal, if the first digital signal is at an even state, and producing a reset signal, if the first digital signal is at an odd state; outputting selectively a corresponding pulse signal of the second pulse signals for the case where the first digital signal is produced by detecting rising (falling) edges from a $1_{st}$ pulse signal to the $n_{th}$ pulse signal of the first pulse signals, and outputting selectively a (corresponding number+1)$_{th}$ pulse signal of the second pulse signals for the case where the first digital signal is produced by detecting falling (or rising) edges from the $1_{st}$ pulse signal to the $n_{th}$ pulse signal of the first pulse signals; generating n number of the second pulse signals being oscillated with a first type in response to the second signal and the set signal, and generating the n number of the second pulse signals being oscillated with a second type in response to the second signal and the reset signal; selecting one pulse signal of the n number of the second pulse signals in response to n number of control signals to output a selected output signal; counting in response to the selected output signal to produce a third digital signal; and comparing the second digital signal with the third digital signal, and delaying and outputting the selected output signal by the fourth delay time, if the second digital signal is equal to the third digital signal.

Other aspects, features and advantages of the present invention are disclosed in the detailed description that follows.

BRIEF DESCRIPTION OF THE DRAWINGS

For a more complete understanding of the present invention and the advantages thereof, reference is now made to the following description taken in conjunction with the accompanying drawings, in which like reference numerals designate like elements, and in which.

DETAILED DESCRIPTION OF PREFERRED EMBODIMENTS

Figure 1:
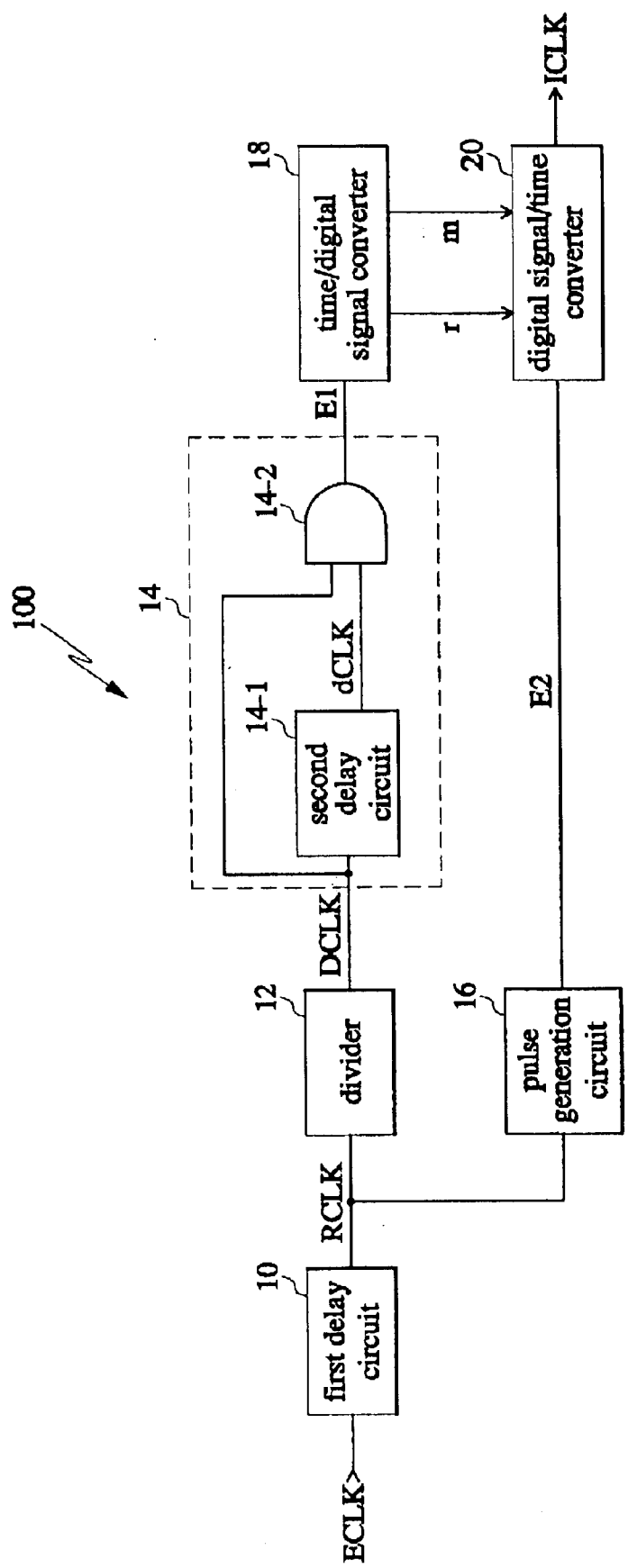
FIG. 1 shows a block diagram of an internal clock signal generation circuit according to an embodiment of the present invention.

Preferred embodiments of the present invention will now be described with reference to the accompanying drawings. Like reference numerals in the drawings designate like elements.

As shown in FIG. 1, a block diagram of an internal clock signal generation circuit according to an embodiment of the present invention is indicated generally by the reference numeral 100. The internal clock signal generation circuit 100 includes a first delay circuit 10, a divider 12, a pulse generation circuit 14 including a second delay circuit 14-1 and an AND gate 14-2, a pulse generation circuit 16, a time/digital signal converter 18 and a digital signal/time converter 20.

The first delay circuit 10 delays an external clock signal ECLK by a first delay time d1 to produce a clock signal RCLK. The divider 12 divides the clock signal RCLK by 2 to produce a clock signal DCLK. The second delay circuit 14-1 delays the clock signal DCLK by a delay time tD to produce a clock signal dCLK. The delay time tD is set to time d1+d2+d3. The AND gate 14-2 receives the clock signal DCLK and the clock signal dCLK to output a signal E1 with the pulse width of time(tM=tC−tD, tC indicates a period of the external clock signal ECLK). The time tM indicates a skew monitor delay time. The pulse generation circuit 16 generates a negative pulse signal E2 with the pulse width of the time d2 at the rising edge of the clock signal RCLK. The time/digital signal converter 18 receives the signal E1 to convert the skew monitor delay time tM into digital signals r and m. The digital signal r is a value for fine delay, and the digital signal m is a value for coarse delay. The digital signal/time converter 20 receives the signal E2 and the digital signals r and m to convert the digital signals r and m into the skew monitor delay time tM in response to the signal E2 and generates an internal clock signal ICLK. In other words, the digital signal/time converter 20 reproduces the skew monitor delay time tM at the rising edge of the signal E2 using the digital signals r and m and then produces the internal clock signal ICLK being delayed by the delay time d3 from the skew monitor delay time reproduced.

Figure 2:
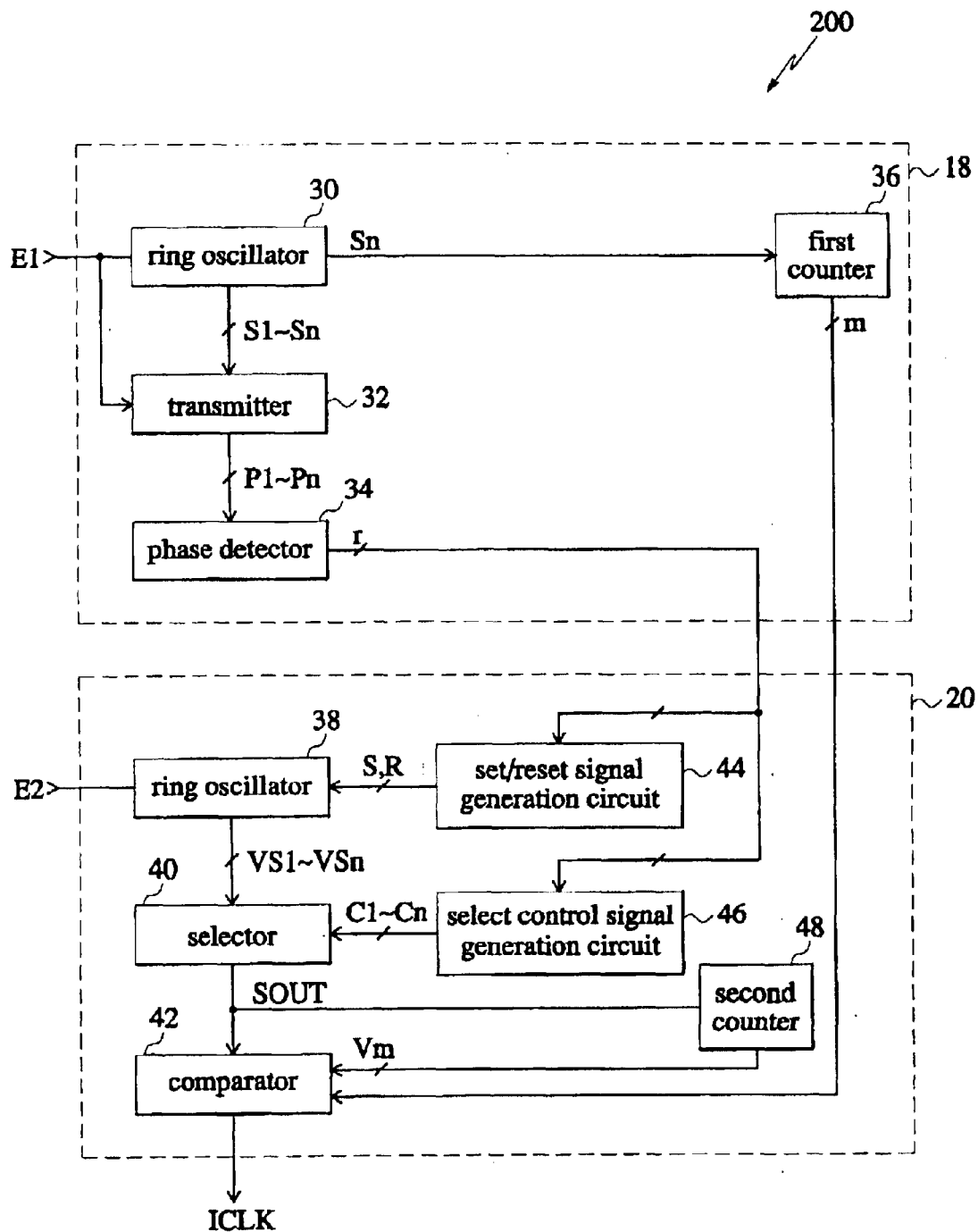
FIG. 2 shows a block diagram representing a structure of a time/digital signal converter and a digital signal/time converter of FIG. 1.

Turning to FIG. 2, a block diagram representing a structure of the time/digital signal converter and the digital signal/time converter of FIG. 1 is indicated generally by the reference numeral 200. In the converter pair 200, a time/digital signal converter 18 comprises a ring oscillator 30, a transmitter 32, a phase detector 34, and a first counter 36. The digital signal/time converter 20 comprises a ring oscillator 38, a selector, a comparator 42, a set/reset signal generation circuit 44, a select control signal generation circuit 46, and a second counter 48.

In operation of the converter pair 200, the ring oscillator 30 produces a plurality of pulse signals S1 through Sn in response to the signal E1. The transmitter 32 transmits the pulse signals S1 through Sn as signals P1 through Pn at the falling edge of the signal E1. The phase detector 34 outputs 2n number of the digital signals r on phases of the signals P1 through Pn, i.e. the phase detector 34 detects signals Pn and Pn+1 at the rising edge of the pulse signal Sn and detects inverted signals PnB and P(n+1)B at the falling edge of the pulse signal Sn. The first counter 36 counts in response to the falling edge of the pulse signal Sn to output the digital signal m. The skew monitor delay time tM is decided by the digital signal m. If a signal propagation delay time each of the inverters in the ring oscillator is tpd, the skew monitor time tM is (2 nm +r)×tpd. Also, the term 2n×tpd is a period t0 of the signals S1 through Sn which are produced by the ring oscillator 30. The ring oscillator 38 is fixed to the same initial state as the signals S1 through Sn in response to the signal E2 of a LOW ("L") level and a reset signal R of a HIGH ("H") level, and generates pulse signals VS1 through VSn toggling with the same delay time as the signals S1 through Sn in response to the signal E2 of the "H" level. The ring oscillator 38 also fixes the initial states of the pulse signals VS1 through VS(n−1) at the "H" level and the initial state of the pulse signal VBn at the "L" level in response to the signal E2 of the "L" level and a set signal S of a "H" level, and generates the pulse signals VS1 through VSn toggling after being delayed from the initial state by time ntpd and tpd through (n−1)tpd in response to the signal E2 of the "H" level. At this time, the ring oscillator 38 generates the pulse signals VS1 through VSn with the same period and duty cycle as the ring oscillator 30. The set/reset signal generation circuit 44 produces the set signal S, when the digital signal r is produced by detecting the inverted signals PnB and P(n+1)B at the falling edge of the pulse signal Sn, and produces the reset signal R, when the digital signal r is produced by detecting the signals Pn and Pn+1 at the rising edge of the pulse signal Sn. The select control signal generation circuit 46 produces control signals C1 through Cn to output selectively the corresponding pulse signals VS1 through VSn in case that the digital signal r is produced by detecting the rising edges of the pulse signals S1 through Sn, and produces the control signals C1 through Cn to output selectively the corresponding pulse signals VS2 through VSn and VS1 in case that the digital signal r is produced by detecting the falling edges of the pulse signals S1 through Sn. The selector 40 selects one of the signals VS1 through VSn in response to the control signals C1 through Cn to output a signal SOUT. The second counter 48 counts in response to the signal SOUT to output a signal Vm. The comparator 42 compares the signal Vm with the digital signal m, and if the signal Vm is equal to the digital signal m, inputs the signal SOUT to output the internal clock signal ICLK. The comparator 42 receives the signal SOUT that is delayed by the skew monitor delay time tM in response to the signal E2 and delays it by the delay time d3 to generate the internal clock signal ICLK.

Figure 3:
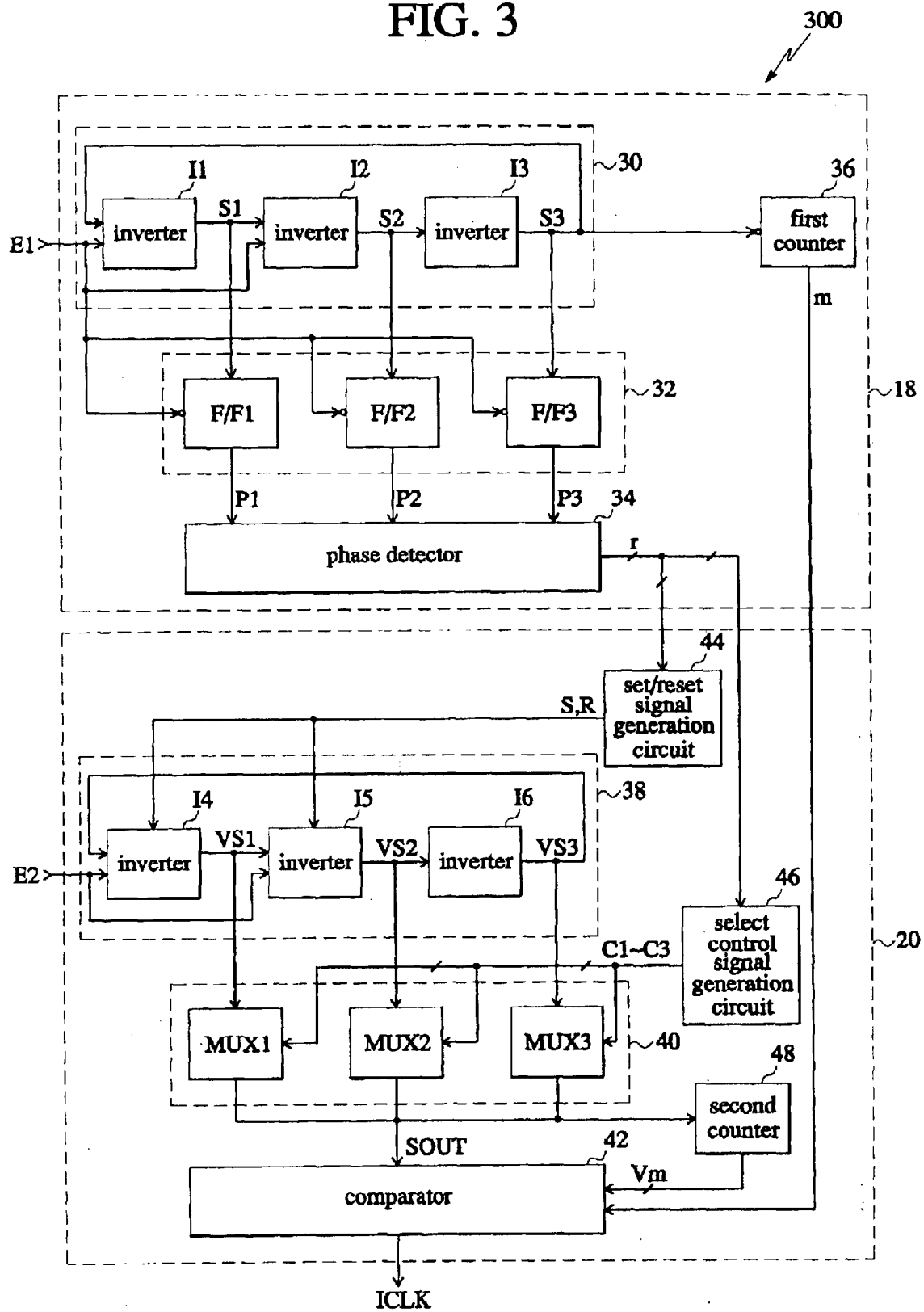
FIG. 3 shows a block diagram representing a structure of the time/digital signal converter and the digital signal/time converter according to the embodiment of FIG. 2.

Turning now to FIG. 3, a block diagram representing a structure of the time/digital signal converter and the digital signal/time converter according to an embodiment of FIG. 2 is indicated generally by the reference numeral 300. Here, the ring oscillator includes inverters I1, I1 and I3. The transmitter 32 includes flip-flops F/F1, F/F2 and F/F3. In addition, the ring oscillator 38 includes inverters I4, I5 and I6. The selector 40 includes multiplexers MUX1, MUX2 and MUX3.

In operation of the converter pair 300, the ring oscillator 30 produces the pulse signals S1, S2 and S3 in response to the signal E1. At this time, the inverters I1, I2 and I3 in the oscillator 30 have same delay time each other. The first counter 36 counts in response to the falling edge of the pulse signal S3 to produce the digital signal m. The flip flops F/F1, F/F2 and F/F3 receive the pulse signals S1, S2 and S3 in response to the falling edge of the signal E1 to generate the signals P1, P2 and P3, respectively. The phase detector 34 produces six digital signals r "000001", "000010", "000100", "001000", "010000", "100000" according to the phases of the signals P1, P2 and P3. In other words, when the phase of the signals P1, P2 and P3 input to the phase detector 34 are "H" level, "H" level, and "L" level, respectively, the digital signal r is "000001". When the phases of the signals P1, P2 and P3 are "H" level, "L" level and "L" level, the digital signal r is "000010". When the phases of the signals are "H" level, "L" level and "H" level, the digital signal r is "000100". When the phases of the signals are "L" level, "L" level and "H" level, the digital signal r is "001000". When the phases of the signals are "L" level, "H" level and "H" level, the digital signal r is "010000" and when the phases of the signals are "L" level, "H" level and "L" level, the digital signal r is "100000". At this time, the produced digital signal r is irrespective of a 3-bit signal representing six different kinds of signals. The ring oscillator 38 generates the pulse signals VS1, VS2 and VS3 in response to the signal E2. At this time, the inverters I4, I5 and I6 in the ring oscillator 38 have the same delay time as the inverters I1, I2 and I3 in the ring oscillator 30. The set/reset generation circuit 44 generates the set signal S, when the digital signal r is "000010", "001000", "100000", and generates the reset signal R, when the digital signal r is "000001", "000100", "010000". The select control signal generation circuit 46 generates the control signal C1, when the digital r is "100000", "000001", generates the control signal C3, when the digital signal r is "000010", "000100", and generates the control signal C2, when the digital signal r is "001000", "010000". The multiplexers MUX1, MUX2 and MUX3 output a signal SOUT by selecting one of the signals VS1, VS2 and VS3 in response to the control signals C1, C2 and C3. The second counter 48 counts in response to the signal SOUT to output the signal Vm. The comparator 42 compares the signal Vm with the signal m, and if the signal Vm is equal to the signal m, receives the signal SOUT to produce the internal clock signal ICLK.

Figure 4:
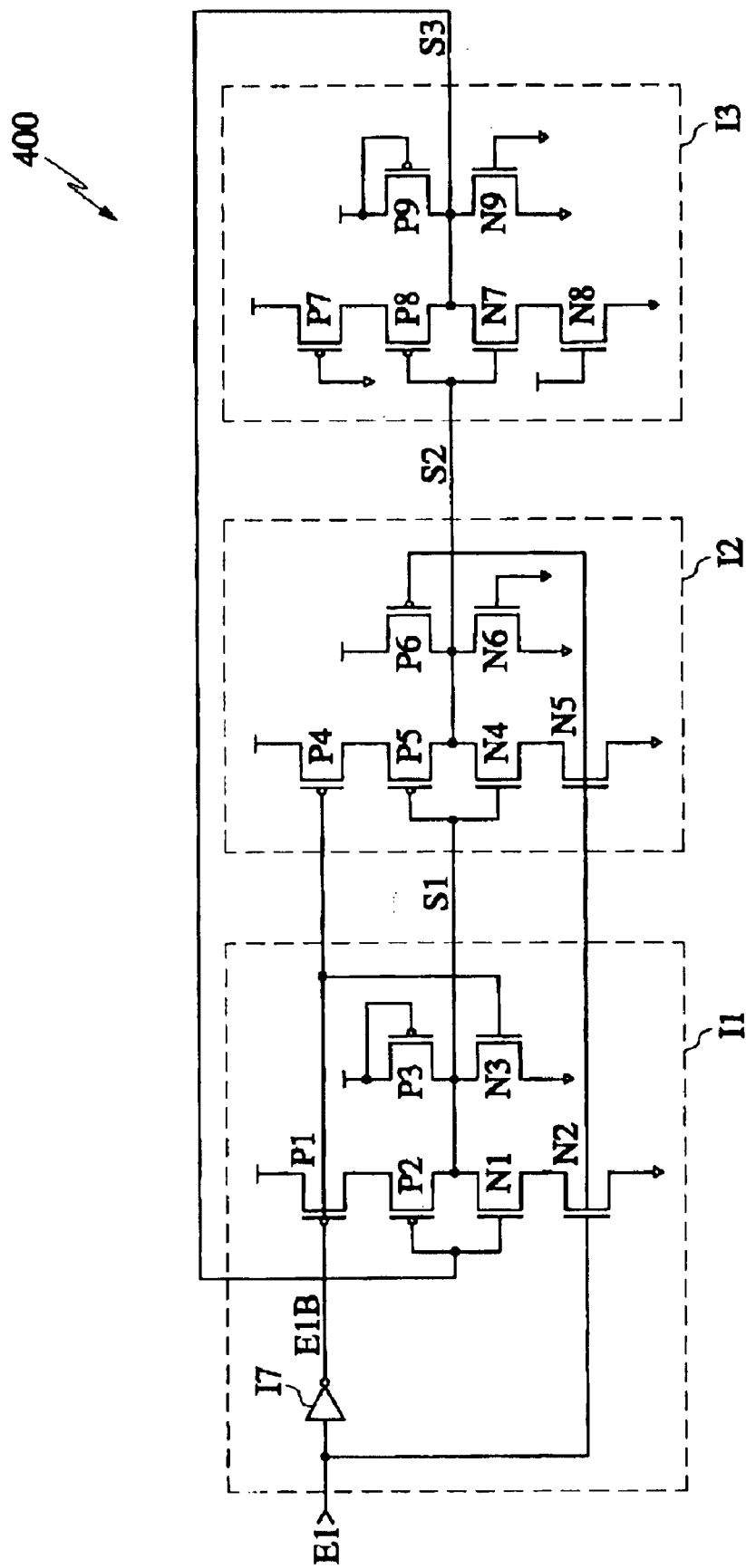
FIG. 4 shows a detailed circuit diagram of a ring oscillator according to the embodiment of FIG. 2.

As shown in FIG. 4, a detailed circuit of the ring oscillator 30 according to an embodiment of FIG. 2 is indicated generally by the reference numeral 400. The ring oscillator 400 includes an inverter I1 including an inverter I7, PMOS transistors P1, P2 and P3 and NMOS transistors N1, N2 and N3, an inverter I2 including PMOS transistors P4, P5 and P6 and NMOS transistors N4, N5 and N6, and an inverter I3 including PMOS transistors P7, P8 and P9 and NMOS transistors N7, N8 and N9.

The operation for each of the blocks of the oscillator 400 will now be described in detail. When the signal E1 of the "L" level is input to the inverter I7, the invert I7 generates a signal E1B of the "H" level. Accordingly, the PMOS transistors P1 and P4 and NMOS transistors N2 and N5 are OFF, and the NMOS transistor N3 and PMOS transistor P6 are ON. The inverter I1 generates the signal S1 of the "L" level, and the inverter I2 generates the signal S2 of the "H" level. And, the inverter I3 inverts the signal S2 of the "H" level to output the signal S3 of the "L" level. In other words, when the signal E1 of the "L" level is input to the inverter I7, the signals S1, S2 and S3 are fixed to the "L" level, the "H" level, and the "L" level, respectively.

When the signal E1 of the H level is input to the inverter I7, the inverter I7 produces the signal E1B of the "L" level. Accordingly, the PMOS transistors P1 and P4 and NMOS transistors N2 and N5 are ON, and the NMOS transistor N3 and PMOS transistor P6 are OFF. Thus, the operation of the inverters I1 and I2 will be enabled. So, the inverter I1 inverts and delays the signal S3 to output the signal S1 and the inverter I2 inverts and delays the signal S1 to output the signal S2, and the inverter I3 inverts and delays the signal S2 to output the signal S3. Accordingly, when the delay time each of the inverters I1, I2 and I3 is equal to the time td, if the signal E1 of the H level is provided, the inverters I1, I2 and I3 produce the pulse signals S1, S2 and S3 with the duty cycle of 50% and the period of 6td. The pulse signals S1, S2, S3 are individually the signals toggling in order with the delay time td from the rising edge of the signal E1.

Figure 5:
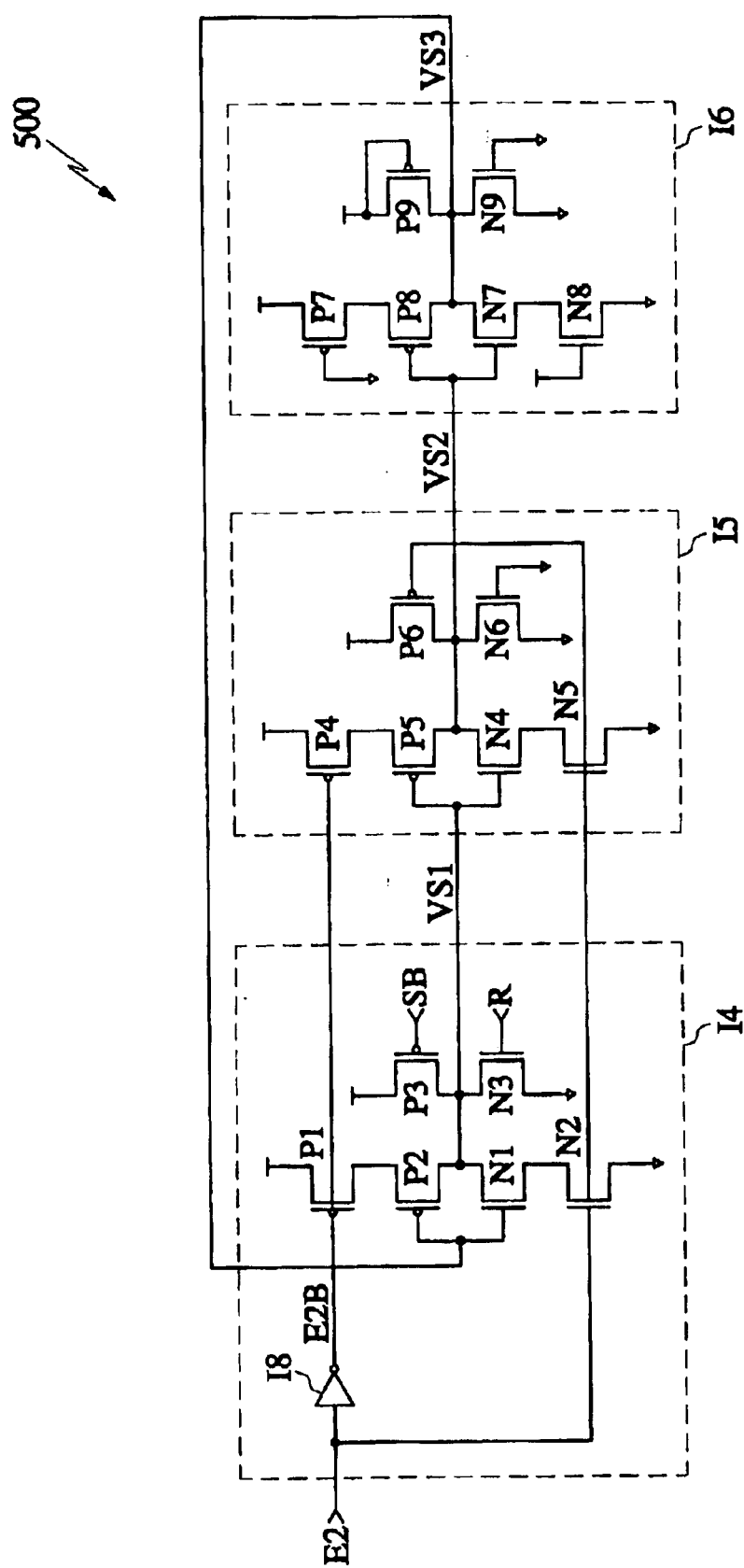
FIG. 5 shows a detailed circuit diagram of another ring oscillator according to the embodiment of FIG. 2.

Turning to FIG. 5, a detailed circuit of a ring oscillator 38 according to the embodiment of FIG. 2, constituted of the same elements as those of the ring oscillator 400 of FIG. 4, is indicated generally by the reference numeral 500. The ring oscillator 500 differs from the ring oscillator 400 in that an inverted set signal SB is input to a gate of the PMOS transistor P3 and the reset signal R is input to a gate of the NMOS transistor N3 in the ring oscillator 38.

In operation of the circuit 500, when the signal E2 of the L level is input to an inverter I8, the inverter I8 produces a signal E2B of the "H" level. Accordingly, the PMOS transistors P1 and P4 and NMOS transistors N2 and N5 are OFF, and the PMOS transistor P6 is ON. At this time, if the inverted set signal SB and the reset signal R are at the "H" level, the PMOS transistor P3 is OFF and the NMOS transistor N3 is ON, thereby producing the signal VS1 of the "L" level. Also, the PMOS transistor P6 is ON to produce the signal VS2 of the "H" level. The inverter I6 inverts and delays the signal VS2 of the "H" level to produce the signal VS3 of the "L" level. In other words, the signals VS1, VS2 and VS3 are individually fixed to the "L" level, "H" level and "L" level. On the contrary, if the inverted set signal SB and the reset signal R are at the "L" level, the signals VS1, VS2 and VS3 are individually fixed to the "H" level, the "H" level and the "L" level.

When the signals VS1, VS2 and VS3 are individually fixed to the "L" level, the "H" level and the "L" level, if the signal E2 is driven to an "H" level and the inverted set signal of the "H" level and the rest signal R of the "L" level are produced, the PMOS transistors P1 and P4 and the NMOS transistors N2 and N5 are ON and the PMOS transistors P3 and P6 and the NMOS transistors N3 are OFF. The inverter I4 inverts and delays the signal VS3 to generate the signal VS1, the inverter I5 inverts and delays the signal VS1 to generate the signal VS2, and the inverter I6 inverts and delays the signal VS2 to generate the signal VS3. Accordingly, when the delay time each of the inverters I4, I5 and I6 is equal to the time td, if the signal E2 of the "H" level is provided, the inverters I4, I5 and I6 produce the pulse signals VS1, VS2 and VS3 with the duty cycle of 50% and the period of 6td. The pulse signals VS1, VS2 and VS3 are the signals toggling in order with the delay time td, after the signal E2 is driven to the "H" level.

Conversely, when the signals VS1, VS2 and VS3 are individually fixed to the "H" level, the "H" level and the "L" level, if the signal E2 is driven to the "H" level, and if the inverted set signal SB of the ""H" level and the reset signal R of the "L" level is produced, the inverter I4 inverts and delays the signal VS3 to produce the signal VS1, the inverter I5 inverts and delays the signal VS1 to produce the signal VS2, and the inverter I6 inverts and delays the signal VS2 to produce the signal VS3. Accordingly, when the delay time each of the inverters I4, I5 and I6 is equal to the time td, if the signal E2 of the "H" level is provided, the inverters I4, I5 and I6 produce the pulse signals VS2, VS3, and VS1 with the duty cycle of 50% and the period of 6td. At this time, the pulse signals VS1, VS2 and VS3 are the signals toggling in order with the delay time 3td, after the signal E2 is driven to the "H" level.

FIGS. 6 through 11 show timing charts for explaining the operation of the internal clock signal generation circuit according to embodiments of the present invention, indicated generally by the reference numerals 600, 700, 800, 900, 1000 and 1100, respectively.

Referring back to FIG. 1 and FIG. 3, operation of the circuits 100 and 300 will now be described with respect to the timing charts.

Figure 6:
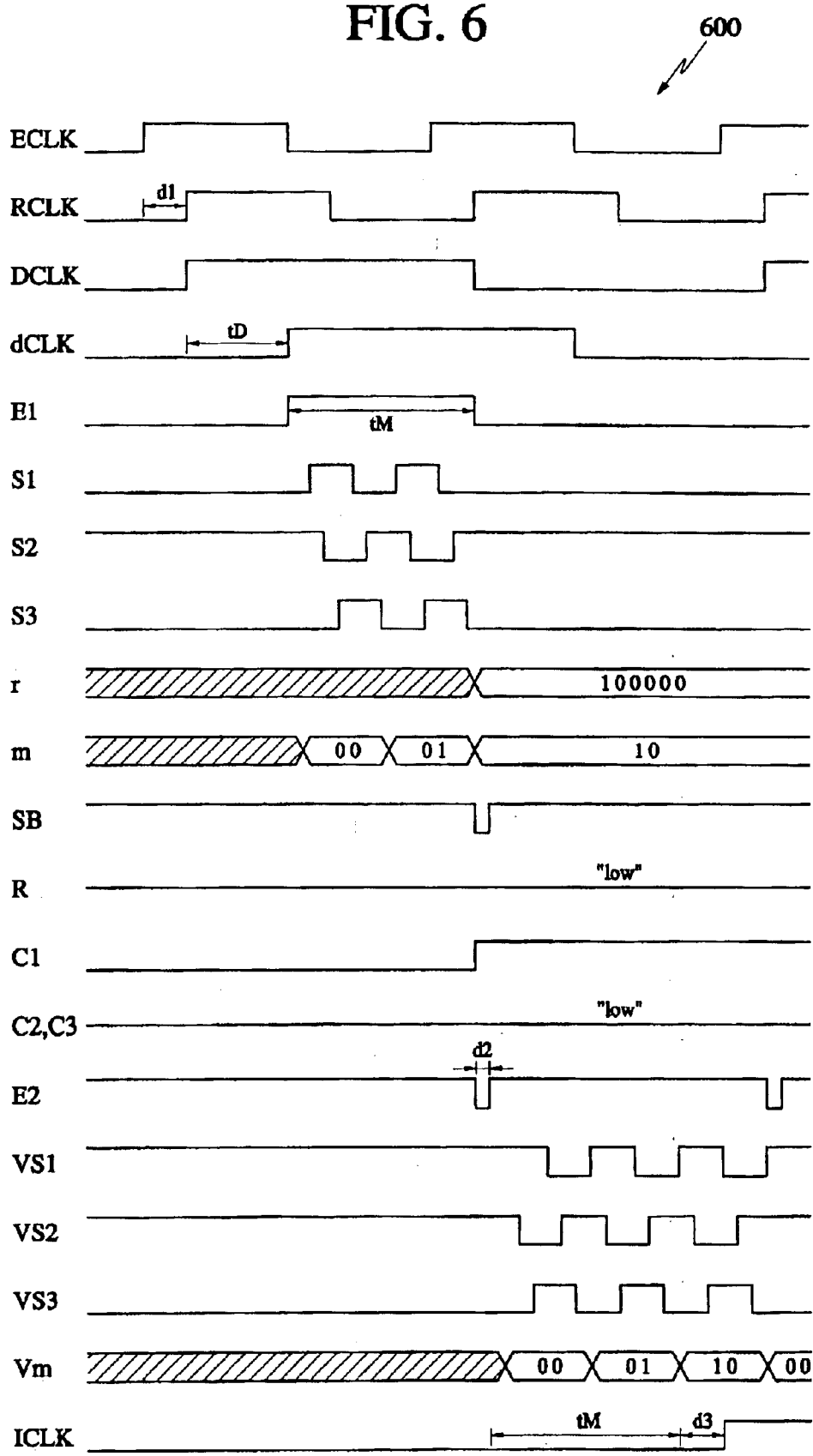
FIGS. 6 through 11 are timing charts for explaining the operation of the internal clock signal generation circuit according to the present invention.

As shown in FIG. 6, the operation of the internal clock signal generation circuit according to the present invention will be described with reference to the timing chart 600.

The first delay circuit 10 delays the external clock signal ECLK by the first delay time d1. The divider 12 divides the signal RCLK by 2 to produce the signal DCLK. The second delay circuit 14 delays the signal DCLK by the second delay time (tD=d1+d2+d3). An AND gate 14-2 receives the signal DCLK and the signal dCLK to produce the signal E1 with the pulse width of the skew monitor delay time (tM=tC−tD, where tC indicates a period of the external clock signal ECLK). The pulse generation circuit 10 generates the negative pulse signal E2 with the pulse width of the time d2 at the rising edge of the signal RCLK. The ring oscillator 30 generates the pulse signals S1, S2 and S3 toggling in the response to the signal E1 of the "H" level. The flip-flops F/F1, F/F2 and F/F3 transmit the signals S1, S2 and S3 of the "L" level, the "H" level and the "L" level at the falling edge of the signal E1. The phase detector 34 outputs the digital signal r of "100000". The first counter 36 counts in response to the falling edge of the pulse signal S3 to produce the digital signal m of "10". At this time, the produced digital signals r and m are the digital values for the skew monitor delay time tM. The set/reset signal generation circuit 44 generates the reset signal R and the inverted set signal SB maintaining the "L" level during the time period of the signal E2 of the "L" level, if the digital signal r of "100000" is input to the circuit 44. The select control signal generation circuit 46 inputs the digital signal r of "100000" to generate the control signal C1 of the "H" level and the control signals C2 and C3 of the "L" level. The ring oscillator 38 generates the pulse signals VS1, VS2 and VS3 toggling in response to the signal E2 of the "H" level. At this time, the produced pulse signals VS1, VS2 and VS3 are respectively fixed to the "H" level, the "H" level and the "L" level in response to the signal E2 of the "L" level and the inverted signal SB of the "L" level, and are toggling after being delayed by the times 3tpd, tpd and 2tpd from the rising edge of the signal E2 in response to the signal E2 of the "H" level and the inverted signal SB of the "H" level. The multiplexer MUX1 inputs the pulse signal VS1 to produce the signal SOUT in response to the control signal C1. The second counter 48 counts in response to the rising edge of the signal SOUT. The comparator 42 compares an output signal of the first counter with an output signal of the second counter 48, and if the output signal of the first counter 36 is equal to the output signal of the second counter 48, produces the signal SOUT as the internal output signal ICLK. At this time, the comparator 42 delays the signal SOUT by the delay time d3 to produce the internal clock signal ICLK. Accordingly, the internal clock generation circuit can produce the internal clock signal ICLK correctly in synchronization with the external clock signal ECLK.

Figure 7:
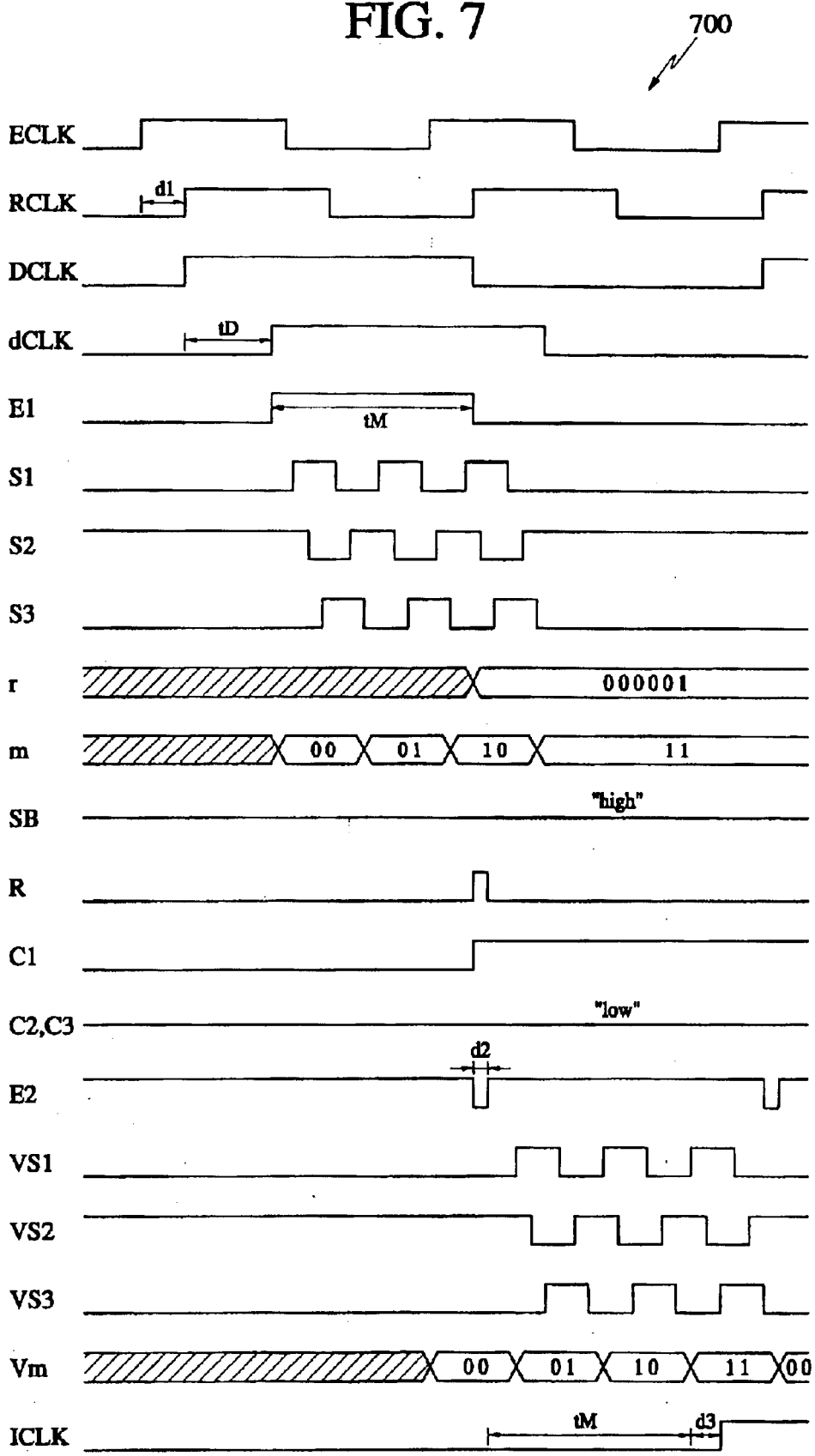

Turning to FIG. 7, operation of the circuits 100 and 300 of FIGS. 1 and 3, respectively, will now be described with respect to the timing chart 700, which shows a case where the skew monitor time tM is greater than the skew monitor time tM of FIG. 6.

In this case, the time/digital signal converter 18 operates to generate the digital signal r of "000001" and the digital signal m of "10" at the falling edge of the signal E1. The set/reset signal generation circuit 44 inputs the digital signal r of "000001" to generate the inverted set signal SB of the "L" level and the reset signal R of the "L" level. The ring oscillator 38 generates the pulse signals VS1, VS2 and VS3 toggling in the response to the signal E2 of the "H" level. At this time, the generated pulse signals VS1, VS2 and VS3 are respectively fixed to the "L" level, the "H" level and the "L" level in response to the signal E2 of the "L" level and the reset signal R of the "H" level, and are toggling after being delayed by each of the times tpd, 2tpd and 30tpd from the rising edge of the signal E2 in response to the signal E2 of the "H" level and the reset signal R of the "L" level. The select control signal generation circuit 46 inputs the digital signal r of "000001" to generate the control signal C1 of the "H" level and the control signals C2 and C3 of the "L" level. Accordingly, the multiplexer MUX1 inputs the pulse signal VS1 to produce the signal SOUT in response to the control signal C1. The second counter 48 counts in response to the rising edge of the signal SOUT. The comparator 42 compares the digital signal m with the signal Vm, and if the digital signal m is equal to the signal Vm, delays the signal SOUT by the delay time d3 to produce the internal clock signal ICLK.

Figure 8:
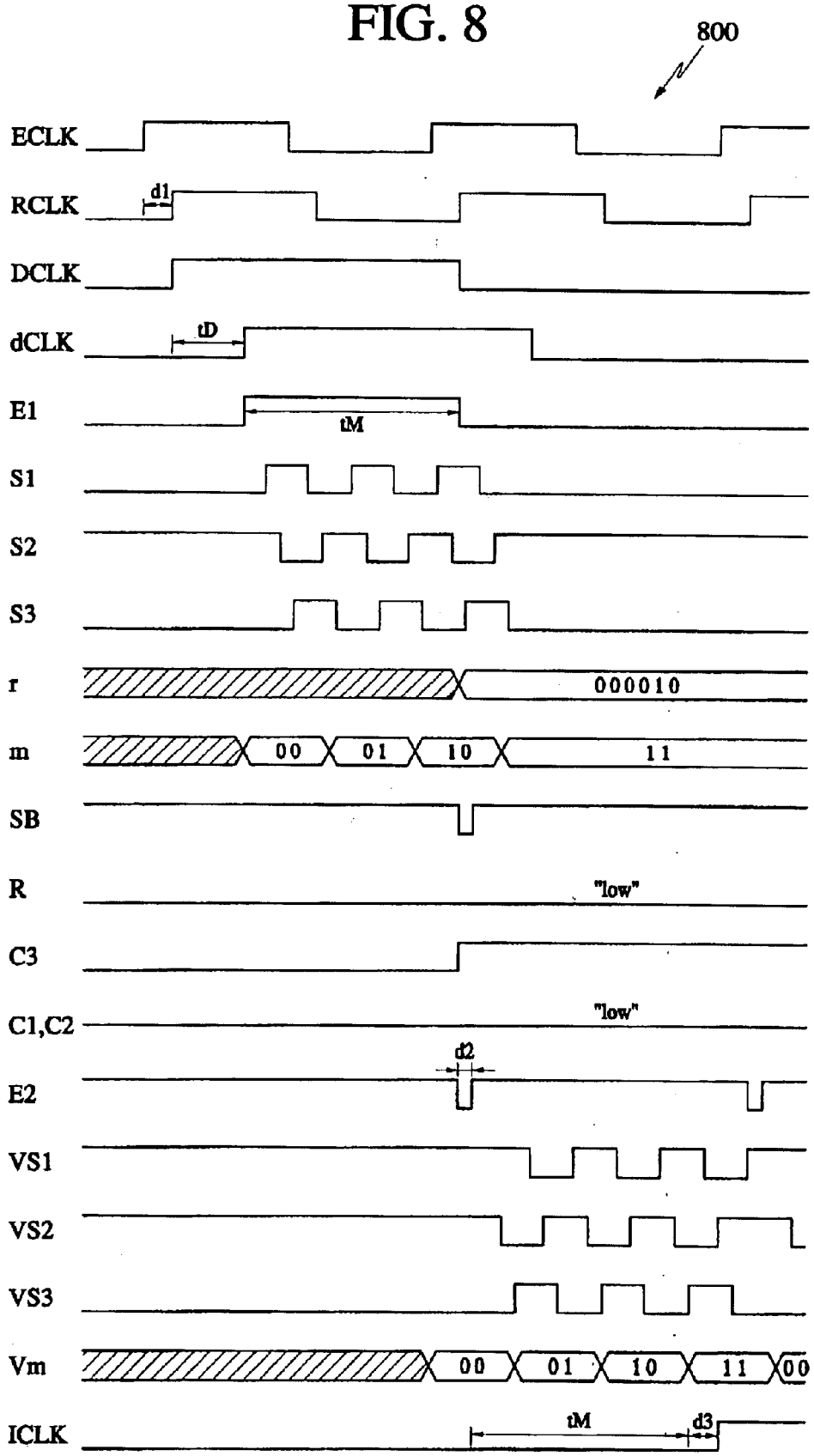

Turning now to FIG. 8, operation of the circuits 100 and 300 of FIGS. 1 and 3, respectively, will now be described with respect to the timing chart 800, which shows a case where the skew monitor time tM is greater than the skew monitor time tM of the timing chart of FIG. 7.

In this case, the time/digital signal converter 18 generates the digital signal r of "000010" and the digital signal m of "10". The ring oscillator 38 generates the pulse signals VS1, VS2 and VS3 toggling in the response to the signal E2 of the "L" level and the inverted set signal SB of the "L" level. At this time, the generated pulse signals VS1, VS2 and VS3 have the same toggling as the pulse signals VS1, VS2 and VS3 of the timing chart of FIG. 6. The select control signal generation circuit 46 inputs the digital signal r of "000010" to generate the control signal C3 of the "H" level and the control signals C1 and C2 of the "L" level. Accordingly, the multiplexer MUX3 inputs the pulse signal VS3 to produce the signal SOUT in response to the control signal C3. The second counter 48 counts in response to the signal SOUT. The comparator 42 compares the digital signal m with the signal Vm, and if the digital signal m is equal to the signal Vm, delays the signal SOUT by the delay time d3 to produce the internal clock signal ICLK. Accordingly, the internal clock generation circuit can produce the internal clock signal ICLK correctly in synchronization with the external clock signal ECLK.

Figure 9:
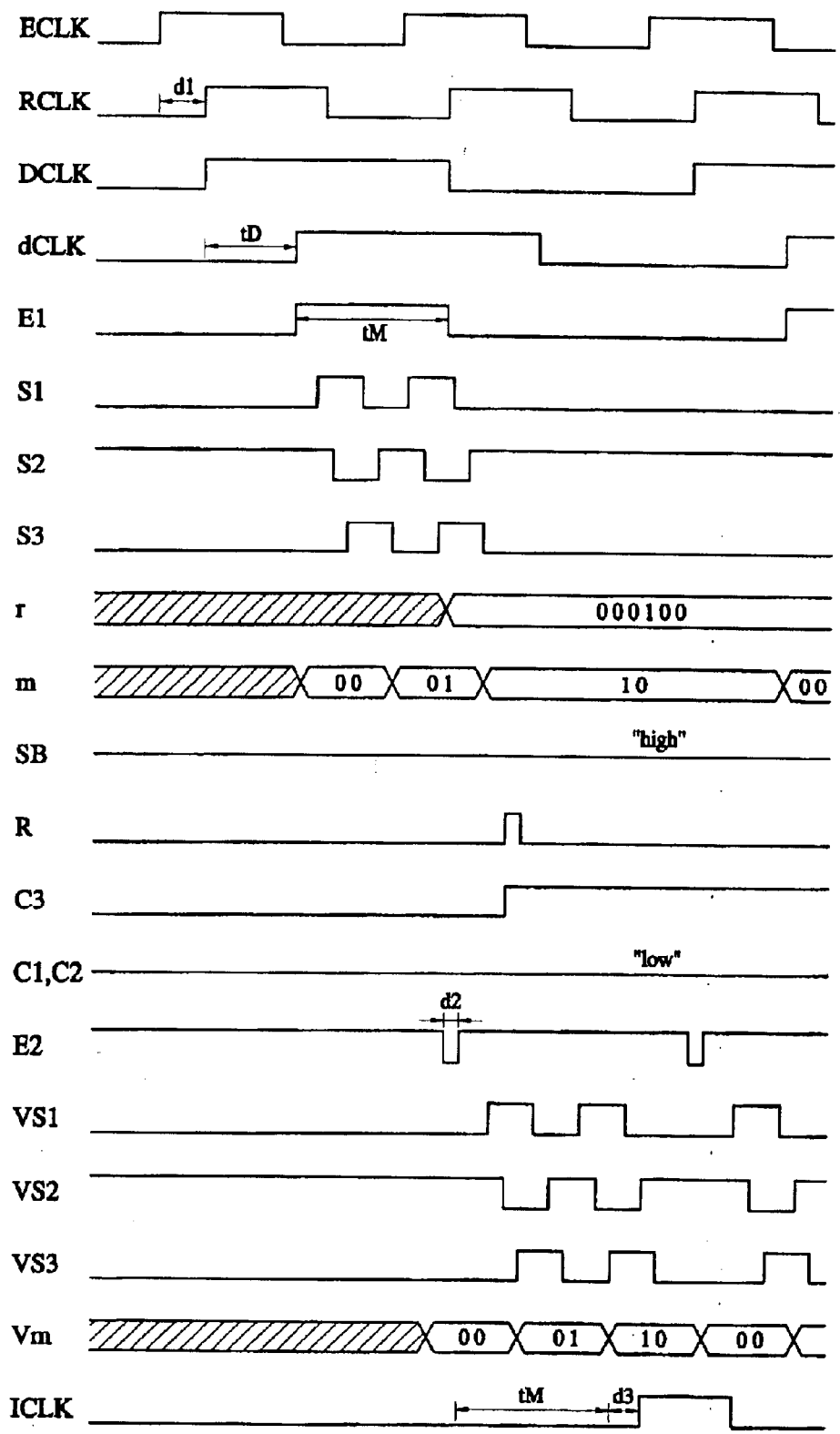
Figure 10:
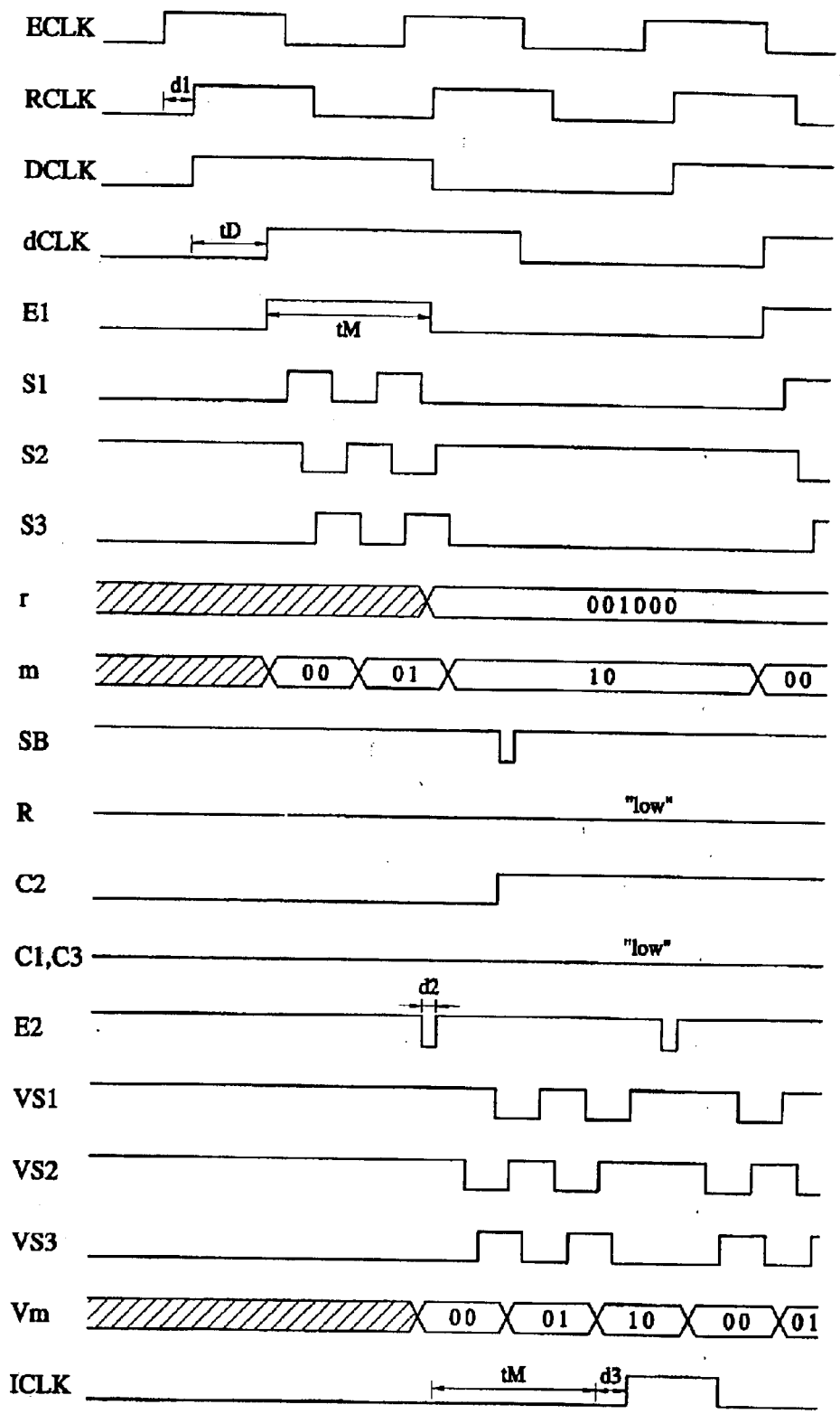
Figure 11:
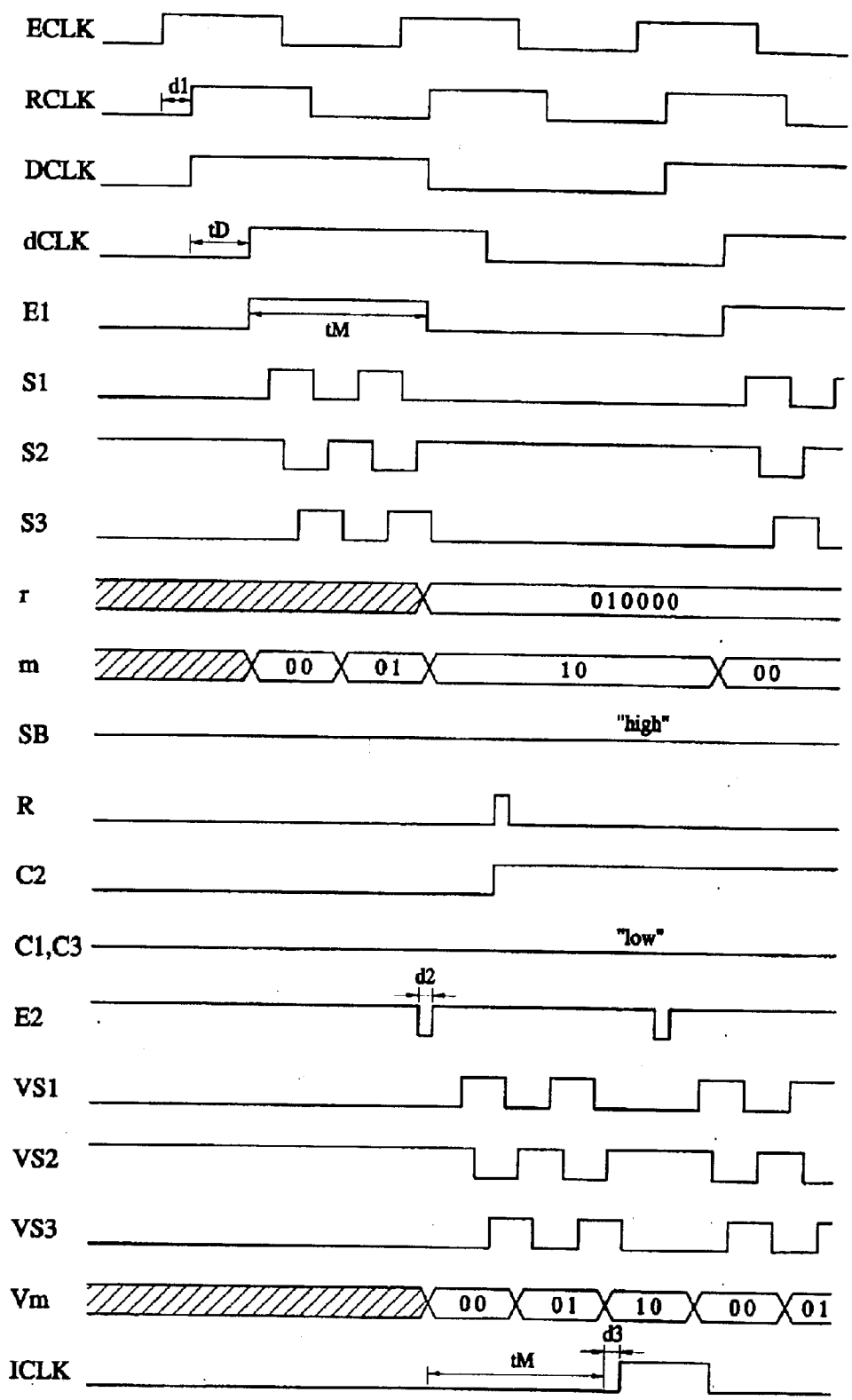

Turning now to FIGS. 9 through 11, a detailed explanation of the timing charts 900, 1000 and 1100 is omitted due to the similarity to the description already provided. Thus, the operation in these cases will be understood and appreciated by those of ordinary skill in the pertinent art by referring to the explanation for the timing charts 600, 700 and 800 of FIGS. 6 through FIG. 8, respectively.

As described above, the internal clock generation circuit shown for the circuit 300 of FIG. 3 has a construction such that the time/digital signal converter 18 and the digital signal/time converter 20 include the counter and the ring oscillator having three inverters, respectively.

Figure 12:
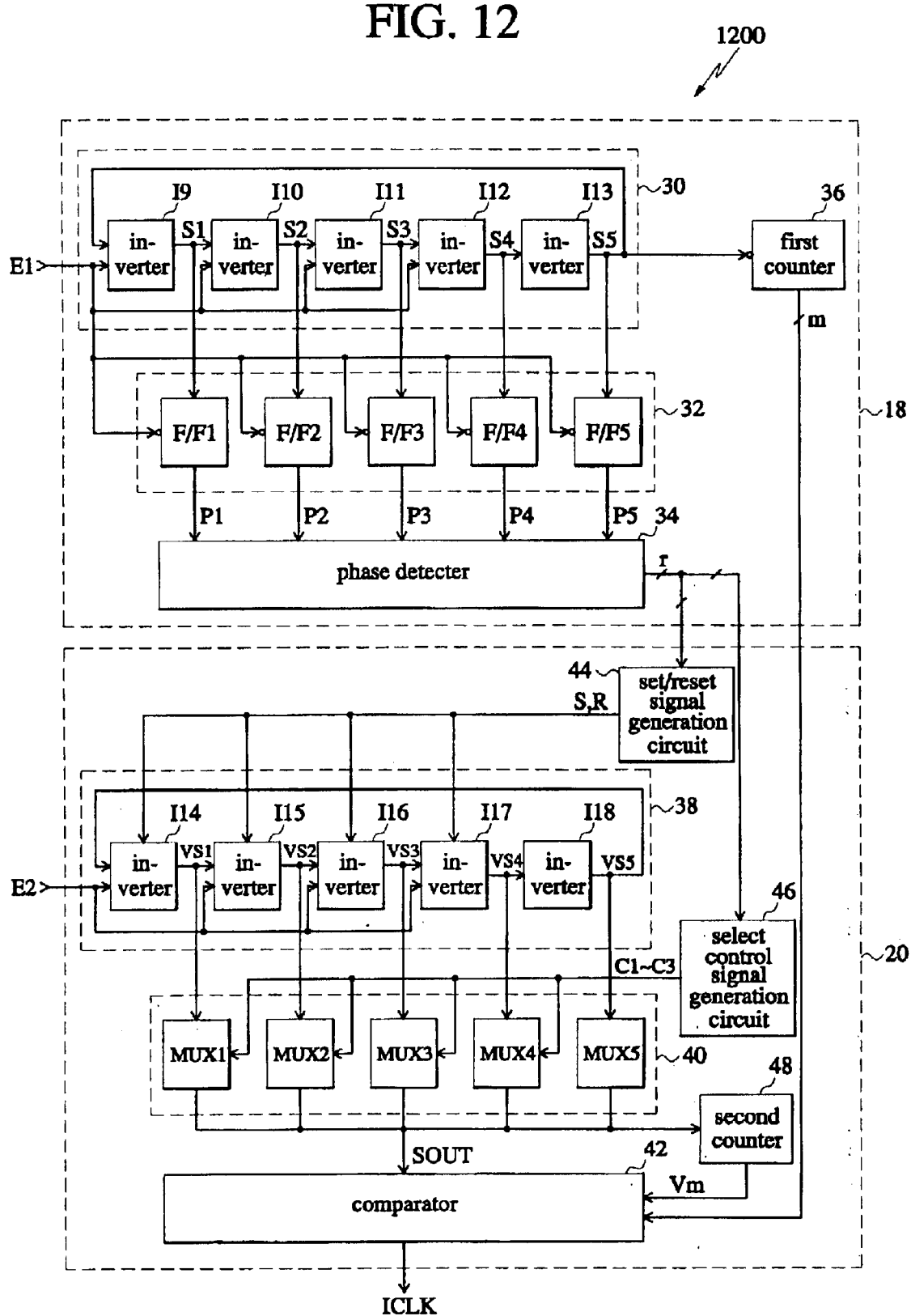
FIG. 12 shows a block diagram of the time/digital signal converter and the digital signal/time converter of FIG. 2 according to another embodiment of the present invention.

As shown in FIG. 12, a block diagram of the time/digital signal converter and the digital signal/time converter according to another embodiment of FIG. 2 is indicated generally by the reference numeral 1200.

In the converter circuit 1200, the ring oscillator 30 includes inverters I9 through I13, the transmitter 32 includes flip-flops F/F1 through F/F5, the ring oscillator 38 includes inverters I14 through I18, and the selector 40 includes multiplexers MUX1 through MUX5. In operation, The ring oscillator 30 produces pulse signals S1 through S5 in response to the signal E1. At this time, the inverters I9 through I13 in the ring oscillator 30 have the same delay time. The counter 36 counts in response to the falling edge of the pulse signal S3 to produce the digital signal m. The flip-flops F/F1 through F/F5 input the pulse signals S1 through S5 to generate signals P1 through P5 at the falling edge in the signal E1, respectively. The phase detector 34 generates ten digital signals r, "0000000001", "0000000010" . . . , "1000000000" according to the phases of the signals P1 through P5. In other words, if the phases of the signals P1 through P5 input to the phase detector 34 is "H" level, "H" level, "L" level, "H" level and "L" level, the phase detector 34 generates the digital signal r of "0000000001". If the phases of the signals P1 through P5 input to the phase detector 34 is "H" level, "L" level, "L" level, "H" level and "L" level, the phase detector 34 generates the digital signal r of "0000000010". If the phases of the signals P1 through P5 input to the phase detector 34 is "L" level, "H" level, "L" level, "H" level and "L" level, the phase detector 34 generates the digital signal r of "1000000000". The ring oscillator 38 generates the pulse signals VS1, VS2, VS3, VS4 and VS5 in response to the signal E2. At this time, the inverters I14 through I18 in the ring oscillator 38 have the same delay time as the inverters (9 through I13 in the ring oscillator 30. The set/reset signal generation circuit 44 generates a set signal S, if the even bit signal of the digital signal r is "1", and generates a reset signal R, if the odd bit signal of the digital signal r is "1". The select control signal generation circuit 46 generates the control signal C1, if the $1_{st}$ bit signal and the $10_{th}$ bit signal of the digital signal r are "1", generates the control signal C3, if the $2_{nd}$ bit signal and the $3_{rd}$ bit signal of the digital signals r are "1", generates the control signal C5, if the $4_{th}$ bit signal and the $5_{th}$ bit signal of the digital signal r are "1", generates the control signal C2, if the $6_{th}$ bit signal and the $7_{th}$ bit signal of the digital signal r are "1", and generates the control signal C4, if the $8_{th}$ bit signal and the $9_{th}$ bit signal of the digital signal r are "1". The multiplexers MUX1 through MUX5 select one of the signals VS1, VS2, VS3, VS4 and VS5 in response to the control signals C1 through C5 to generate the output signal SOUT. The second counter 48 counts in response to the signal SOUT to output the signal Vm. The comparator 42 compares the digital signal m with the signal Vm, and if the digital signal m is equal to the signal Vm, delays the signal SOUT by the delay time d3 to produce the internal clock signal ICLK.

The timing chart of the internal clock signal generation circuit in FIG. 12 is not shown. But, using the same method as indicated for the timing charts of FIGS. 6 through FIG. 11, the internal clock signal generation circuit can produce the internal clock signal ICLK correctly in synchronization with the external clock signal ICLK.

As described above, the internal clock generation circuit according to the embodiment of the present invention shown in the circuit 1200 has a construction such that the time/digital signal converter 18 and the digital signal/time converter 20 include the counter and the ring oscillator having five inverters, respectively. In other words, the internal clock generation circuit does not include a plurality of unit delay circuit each having two inverters connected in series, but can produce the internal clock signal correctly in synchronization with the external clock signal with the construction of the circuit as shown.

Correspondingly, the ring oscillator in the internal clock signal generation circuit of FIG. 12 comprises two more inverters in comparison with the ring oscillator of FIG. 3, but may simply configure the counter, because the value of the digital signal m becomes small in case that the skew monitor time is set to the same.

According to the present invention, the internal clock signal generation circuit is constructed by the counter and the ring oscillator having relatively few inverters, thereby simplifying the structure of the circuit and reducing the layout dimensions.

Further, the internal clock signal generation circuit of the present invention is configured to produce the internal clock signal correctly in synchronization with the external clock signal with a simplified circuit structure.

While the invention has been particularly shown and described with reference to preferred embodiments thereof, it will be understood by those of ordinary skill in the pertinent art that the foregoing and other changes in form and details may be made therein without departing from the spirit and scope of the invention, as set forth in the appended claims.

What is claimed is:

1. A circuit for generating an internal clock signal, the circuit comprising:
   a first delay means for delaying an external clock signal by a first delay time;
   a dividing means for dividing an output signal from the first delay means;
   a first signal generation means for generating a first signal with a pulse width equivalent to a skew monitor time, by delaying an output signal from the dividing means by a second delay time, and by combining the output signal from the dividing means with a signal delayed by the second delay time;
   a second signal generation means for generating a second signal with a pulse width equivalent to a third delay time at an edge of the output signal from the first delay means;
   a time/digital signal converter means for converting the skew monitor time equivalent to the pulse width of the first signal into a first digital signal and a second digital signal in response to the first signal; and
   a digital signal/time converter means for reproducing the skew monitor time by inputting the first and second digital signals in response to the second signal, and generating the internal clock signal being delayed by a fourth delay time from the skew monitor time reproduced.

2. The circuit according to claim 1, wherein the time/digital signal converter means comprises:
   a first ring oscillator for generating n number of first pulse signals in response to the first signal, wherein the first ring oscillator includes n number of first inverting circuits serially connected;
   a transmitter for outputting the n number of the first pulse signals in response to an edge of the first signal;
   a phase detector for detecting phases of the n number of the first pulse signals to produce the first digital signal; and
   a first counter for counting in response to an edge of an $n_{th}$ pulse signal of the n number of the first pulse signals to produce the second digital signal.

3. The circuit according to claim 2, wherein the first inverting circuits comprise:
   first inverters being set for odd pulse signals between a $1_{st}$ pulse signal and a $(n-1)_{th}$ pulse signal of the first pulse signals to a first state in response to a first state of the first signal, and for inverting individually the $n_{th}$ pulse signal of the first pulse signals and even pulse signals of the first pulse signals to generate the odd pulse signals of the first pulse signals in response to a second state of the first signal; and
   second inverters being set for even pulse signals between the $1_{st}$ pulse signal and the $(n-1)_{th}$ pulse signal of the first pulse signals to a second state in response to the first state of the first signal, and for inverting individually the odd pulse signals of the first pulse signals to generate the even pulse signals of the first pulse signals in response to the second state of the first signal; and
   a third inverter for inverting the $(n-1)_{th}$ pulse signal of the first pulse signals to generate the $n_{th}$ signal of the first pulse signals.

4. The circuit according to claim 3, wherein n is an integer of at least 3.

5. The circuit according to claim 3, wherein each of the first inverters comprises:
   a first PMOS transistor having a gate to which an inverted signal of the first signal is input and a source to which a power voltage is applied;
   a first NMOS transistor having a gate to which the first signal is input and a source to which a ground voltage is applied;
   a second PMOS transistor having a gate to which the $n_{th}$ signal of the first pulse signals or one of the even pulse signals of the first pulse signals in a previous stage is input and a source to which a drain of the first PMOS transistor is connected;
   a second NMOS transistor having a gate to which the $n_{th}$ signal of the first pulse signals or the one of the even pulse signals of the first pulse signals in the previous stage is input, a drain to which a drain of the second PMOS transistor is connected, and a source to which a drain of the first NMOS transistor is connected;
   a third PMOS transistor having a gate and a source to which the power voltage is applied, and a drain to which the drain of the second NMOS transistor is connected; and
   a third NMOS transistor having a gate to which the inverted signal of the first signal is input, a drain to which the drain of the third PMOS transistor is connected, and a source to which the ground voltage is applied.

6. The circuit according to claim 3, wherein each of the second inverters comprises:
   a fourth PMOS transistor having a gate to which the inverted signal is input, and a source to which the power voltage is applied;
   a fourth NMOS transistor having a gate to which the first signal is input, and a source to which the ground voltage is applied;
   a fifth PMOS transistor having a gate to which one of the odd pulse signals of the first pulse signals in a previous stage is input, and a source to which a drain of the fourth PMOS transistor is connected;
   a fifth NMOS transistor having a gate to which the one of the odd pulse signals of the first pulse signals in the previous stage is input, a drain to which a drain of the fifth PMOS transistor is connected, and a source to which a drain of the fourth NMOS transistor is connected;
   a sixth PMOS transistor having a gate to which the first signal is input, a source to which the power voltage is applied, and a drain to which the drain of the fifth NMOS transistor is connected; and
   a sixth NMOS transistor having a gate and a source to which the ground voltage is applied, and a drain to which the drain of the sixth PMOS transistor is connected.

7. The circuit according to claim 3, wherein the third inverter comprises:
   a seventh PMOS transistor having a source to which the power voltage is applied, and a gate to which the ground voltage is applied;
   a seventh NMOS transistor having a gate to which the power voltage is applied, and a source to which the ground voltage is applied;
   an eighth PMOS transistor having a drain to which a drain of the seventh PMOS transistor is connected, and a gate to which the $(n-1)_{th}$ pulse is input;

an eighth NMOS transistor having a drain to which a drain of the eighth PMOS transistor is connected, a gate to which the $(n-1)_{th}$ pulse signal is input, and a source to which a drain of the seventh NMOS transistor is connected;

a ninth PMOS transistor having a source and a gate to which the power voltage is applied, and a drain to which the drain of the eighth NMOS transistor is connected; and a ninth NMOS transistor having a source and a gate to which the ground voltage is applied, and a drain to which the drain of the ninth PMOS transistor is connected.

8. The circuit according to claim 2, wherein the transmitter comprises n number of flip flops for latching and outputting the n number of the first pulse signals in response to the edge of the first signals.

9. The circuit according to claim 2, wherein the phase detector detects 2n number of phase states of the n number of the first pulse signals to produce the first digital signal.

10. The circuit according to claim 2, Wherein the digital signal/time converter means comprises:

a set/reset signal generation means that produces a set signal when the first digital signal is at an even state, and produces a reset signal when the first signal is at an odd state;

a second ring oscillator for generating n number of second pulse signals being oscillated with a first type in response to the second signal acid the set signal, and generating the n number of the second pulse signals being oscillated with a second type in response to the second signal and the reset signal, wherein the second ring oscillator includes n number of second inverting circuits connected in series;

a select control signal generation means for producing n number of control signals to output selectively a corresponding pulse signal of the second pulse signals in case that the first digital signal is produced by detecting rising (falling) edges of a $1_{st}$ pulse signal to the $n_{th}$ pulse signal of the first pulse signals, and to output selectively the (corresponding number+1)$_{th}$ pulse signal of the second pulse signals in case that the first digital signal is produced by detecting falling (rising) edges of the $1_{st}$ pulse signal to the $n_{th}$ pulse signal of the first pulse signals;

a selection means for selecting one pulse signal of the n number of the second pulse signals output from the second ring oscillator in response to the n number of the control signals;

a second counter for counting in response to an output signal from the selection means; and a comparison means for comparing an output signal of the first counter with an output signal of the second counter, and delaying and outputting the output signal from the selection means by the fourth delay time when the output signal of the first counter is equal to the output signal of the second counter.

11. The circuit according to claim 10, wherein the second inverting circuits comprise:

a fourth inverter being set a $1_{st}$ pulse signal of the second pulse signals to a first state in response to a first state of the second signal, and for inverting a $n_{th}$ pulse signal of the second pulse signals in response to a second state of the second signal to generate the $1_{st}$ pulse signal of the second pulse signals; and fifth inverters being set a $2_{nd}$ pulse signal to a $(n-1)_{th}$ pulse signal of the second pulse signals to a second state in response to the first state of the second signal, and for inverting individually the $1_{st}$ pulse signal to a $(n-2)_{th}$ pulse signal of the second pulse signals to generate the $2_{nd}$ pulse signal to the $(n-1)_{th}$ pulse signal of the second pulse signals in response to the second state of the second signal; and a sixth inverter for inverting the $(n-1)_{th}$ signal of the second pulse signals to generate the $n_{th}$ pulse signal of the second pulse signals.

12. The circuit according to claim 11, wherein the fourth inverter comprises:

a tenth PMOS transistor having a gate to which an inverted signal of the second signal is input and a source to which a power voltage is applied;

a tenth NMOS transistor having a gate to which the second signal is input and a source to which the ground voltage is applied;

an eleventh PMOS transistor having a gate to which the $n_{th}$ signal of the second pulse signals is input, and a source to which a drain of the tenth PMOS transistor is connected;

an eleventh NMOS transistor having a gate to which the $n_{th}$ signal of the second pulse signals is input, a drain to which a drain of the eleventh PMOS transistor is connected, and a source to which a drain of the tenth NMOS transistor is connected;

a twelfth PMOS transistor having a source to which the power voltage is applied, a gate to which an inverted signal of the set signal is input, and a drain to which the drain of the eleventh NMOS transistor is connected; and a twelfth NMOS transistor having a source to which the ground voltage is applied, a gate to which the reset signal is input, and a drain to which the drain of the twelfth PMOS transistor is connected.

13. The circuit according to claim 11, wherein each of the fifth inverters comprises:

a thirteenth PMOS transistor having a gate to which the inverted signal of the second signal is input and a source to which the power voltage is applied;

a thirteenth NMOS transistor having a gate to which the second signal is input and a source to which the ground voltage is applied;

a fourteenth PMOS transistor having a gate to which one pulse signal of the second pulse signals in a previous stage is input, and a source to which a drain of the thirteenth PMOS transistor is connected;

a fourteenth NMOS transistor having a gate to which the one pulse signal of the second pulse signals in the previous stage is input, a drain to which a drain of the fourteenth PMOS transistor is connected, and a source to which a drain of the thirteenth NMOS transistor is connected;

a fifth PMOS transistor having a source to which the power voltage is applied, a gate to which the second signal is input, and a drain to which the drain of the fourteenth NMOS transistor is connected; and a fifteenth NMOS transistor having a gate and a source to which the ground voltage is applied, and a drain to which the drain of the fifteenth PMOS transistor is connected.

14. The circuit according to claim 11, wherein the sixth inverter comprises:

a seventh PMOS transistor having a source to which the power voltage is applied, and a gate to which the ground voltage is applied;

a seventh NMOS transistor having a gate to which the power voltage is applied, and a source to which the ground voltage is applied;

an eighth PMOS transistor having a drain to which a drain of the seventh PMOS transistor is connected, and a gate to which the $(n-1)_{th}$ pulse is input;

an eighth NMOS transistor having a drain to which a drain of the eighth PMOS transistor is connected, a gate to which the $(n-1)_{th}$ pulse signal is input, and a source to which a drain of the seventh NMOS transistor is connected;

a ninth PMOS transistor having a source and a gate to which the power voltage is applied, and a drain to which the drain of the eighth NMOS transistor is connected; and a ninth NMOS transistor having a source and a gate to which, the ground voltage is applied, and a drain to which the drain of the ninth PMOS transistor is connected.

15. The circuit according to claim 10, wherein the selection means comprises n number of multiplexers for multiplexing the n number of the second pulse signals in response to each of the n number of the control signals.

16. A method for generating an internal clock signal, the method comprising:

generating a first clock signal by delaying an external clock signal by a first delay time;

generating a second clock signal by dividing the first clock signal;

generating a third clock signal by delaying the second clock signal by a second delay time, and generating a first signal with a pulse width equivalent to a skew monitor time in combination with the second clock signal and the third clock signal;

generating a second signal with a pulse width equivalent to third delay time at least one of a falling and rising edge of the first clock signal;

converting the skew monitor time equivalent to the pulse width of the first signal into a first and a second digital signals in response to the first signal; and reproducing the skew monitor time by inputting the first and the second digital signals in response to the second signal, and generating the internal clock signal being delayed by a fourth delay time from the skew monitor time reproduced.

17. The method according to claim 16, wherein converting the skew monitor time into the digital signals comprises;

generating n number of first pulse signals being oscillated in response to the first signal;

outputting the n number of the first pulse signals in response to at least one of a falling and rising edge of the first signal; and detecting phases of the n number of the first pulse signals to produce the first digital signal, and counting in response to at least one of a falling and rising edge of a $n_{th}$ pulse signal of the n number of the first pulse signals to produce the second digital signal.

18. The method according to claim 16, wherein the reproducing the skew monitor time and generating the internal clock signal, comprises:

producing a set signal when the first digital signal is at even states, and producing a reset signal when the first digital signal is at odd states;

outputting selectively a corresponding pulse signal of second pulse signals in case that the first digital signal is produced by detecting at least one of the rising and falling edges of a $1_{st}$ pulse signal to a $n_{th}$ pulse signal of the first pulse signals, and outputting selectively a (corresponding number+1)$_{th}$ pulse signal of the second pulse signals in case that the first digital signal is detecting the at least one of the falling and rising edges of the $1_{st}$ pulse signal to $n_{th}$ pulse signal of the first pulse signals;

generating n number of the second pulse signals being oscillated with a first type in response to the second signal and the set signal, and generating the n number of the second pulse signals being oscillated with a second type in response to the second signal and the reset signal;

selecting one of the n numbers of the second pulse signals in response to n number of control signals to output a selected output signal;

counting in response to the selected output signal to produce a third digital signal; and comparing the second digital signal with the third digital signal, and delaying and outputting the selected output signal by the fourth delay time, when the second digital signal is equal to the third digital signal.

19. The method according to claim 16, wherein the second delay time corresponds to a sum of the first delay time, the third delay time and the fourth delay time.

20. The method according to claim 16, wherein generating the second signal with a pulse width equivalent to the third delay time is at a falling edge of the first clock signal.

* * * * *